US007643642B2

(12) United States Patent
Patino et al.

(10) Patent No.: US 7,643,642 B2

(45) Date of Patent: Jan. 5, 2010

(54) METHOD AND SYSTEM FOR OPERATING ACCESSORY CONTROLS

(75) Inventors: Joseph Patino, Pembroke Pines, FL (US); Russell L. Simpson, Miami, FL (US); Richard Pyatt, Fitchburg, MA (US); Scott A. Tassi, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 670 days.

(21) Appl. No.: 10/842,359

(22) Filed: May 10, 2004

(65) Prior Publication Data

US 2005/0249354 A1 Nov. 10, 2005

(51) Int. Cl.

| | |
|---|---|
| ***H03F 99/00*** | (2006.01) |
| ***H04R 27/00*** | (2006.01) |
| ***H04R 29/00*** | (2006.01) |

(52) U.S. Cl. .......................... 381/120; 381/84; 381/59; 381/58

(58) Field of Classification Search .................. 381/58, 381/59, 120, 80, 84; 455/120–121

See application file for complete search history.

(56) References Cited

U.S. PATENT DOCUMENTS

| | | | | |
|---|---|---|---|---|
| 4,006,396 | A | 2/1977 | Bogut | |
| 4,792,986 | A | 12/1988 | Garner et al. | |
| 5,118,309 | A | 6/1992 | Ford | |
| 6,385,322 | B1 * | 5/2002 | Mietling | 381/82 |
| 6,573,786 | B2 * | 6/2003 | Lee et al. | 330/51 |
| 7,224,992 | B2 | 5/2007 | Patino et al. | |
| 2004/0156522 | A1 * | 8/2004 | Kobata et al. | 381/370 |
| 2005/0032500 | A1 * | 2/2005 | Nashif et al. | 455/345 |
| 2006/0123138 | A1 | 6/2006 | Perdomo et al. | |

OTHER PUBLICATIONS

U.S. Appl. No. 10/683,596, Patino et al.

* cited by examiner

*Primary Examiner*—Xu Mei
*Assistant Examiner*—George C Monikang

(57) ABSTRACT

The invention concerns an accessory (112) for coupling to a portable electronic device (110). The accessory includes an interface (120) for coupling to the portable electronic device, an identifier (124) in which the identifier generates at least in part a parameter and at least one speaker (128). Only if the accessory contains more than one speaker, the parameter generated at least in part by the identifier causes an audio amplifier (148) that drives one of the speakers to be activated. In addition, the parameter generated at least in part by the identifier can cause the audio amplifier to be deactivated if the accessory contains only one speaker.

27 Claims, 6 Drawing Sheets

METHOD AND SYSTEM FOR OPERATING ACCESSORY CONTROLS

BACKGROUND OF THE INVENTION

1. Field of the Invention

This invention relates in general to portable electronic devices and their accessories and more particularly to methods of operating the accessories.

2. Description of the Related Art

Portable electronic devices are ubiquitous in today's society. Many of these devices, such as cellular telephones, two-way radios or personal digital assistants, include connectors for receiving a wide variety of accessories. For example, many of these devices can receive a headset accessory that includes one or more speakers and a microphone. Many headsets now include two speakers, while a significant number of headsets only have one speaker. To accommodate both types of headsets, the portable electronic device to which a headset will be coupled may include two separate audio amplifiers because two-speaker headsets may require them to deliver stereo audio.

Such an arrangement works efficiently for two-speaker headsets, as both amplifiers are used to provide audio gain. If the headset only includes one speaker, however, only one of the amplifiers will be used to amplify audio; the remaining amplifier will simply cause a needless current drain, a disadvantage that simply cannot be afforded because of the limited amount of battery life in today's portable electronic devices. Additionally, the unused amplifier may be susceptible to damage because it may be grounded when the one-speaker headset is coupled to the portable electronic device.

SUMMARY OF THE INVENTION

The present invention concerns a method for operating accessory controls. The method includes the steps of receiving an accessory, measuring at least one parameter generated at least in part by an identifier in the accessory and in response to the measuring step, activating an audio amplifier. The audio amplifier is only activated if the accessory contains more than one speaker. The method can also include the step of maintaining the audio amplifier in a deactivated state if the accessory contains only one speaker. In addition, the method can include the step of comparing the measured parameter against a table of predetermined measurements that correspond to predetermined operational settings.

As an example, the accessory can be a headset for coupling to a portable electronic device, and the headset can be either a stereo headset accessory or a mono headset accessory. As another example, the headset can be either a four-pole headset with push-to-talk capability or a five-pole headset with push-to-talk capability. The identifier can be a resistive element, an open circuit or a short circuit, and the measured parameter can be a voltage.

In yet another arrangement, the method can include the steps of generating an interrupt signal when at least part of an accessory control is activated and in response to the generating step, measuring another parameter created at least in part by the activation of the accessory control. As an example, the accessory control can be a number of control switches that correspond to functions to be performed by a portable electronic device, and the control switches can be in parallel with the identifier. As a more specific example, the control switches can be buttons on the accessory that control the operation of a digital music file player.

The present invention also concerns an accessory for coupling to a portable electronic device. The accessory includes an interface for coupling to the portable electronic device, an identifier in which the identifier generates at least in part a parameter and at least one speaker. Only if the accessory contains more than one speaker, the parameter generated at least in part by the identifier causes an audio amplifier that drives one of the speakers to be activated. The accessory may also include suitable software and/or circuitry to carry out the processes described above.

The present invention also concerns a system for operating accessory controls. The system includes an accessory having an identifier and an interface in which the identifier generates at least in part a parameter and a portable electronic device having at least two audio amplifiers for driving corresponding speakers of the accessory, an interface and a processor. The accessory interface couples to the portable electronic device interface. The processor is programmed to measure the generated parameter and in response, activate the two amplifiers only if the accessory has more than one speaker. The system can also include suitable software and/or circuitry to carry out the processes described above.

The present invention also concerns a portable electronic device. The portable electronic device includes an interface for receiving an accessory having an identifier, at least two audio amplifiers for driving speakers of the accessory and a processor. The processor is programmed to measure a parameter generated at least in part by the identifier of the accessory and in response, activate both amplifiers only if the accessory includes more than one speaker. The portable electronic device also includes suitable software and/or circuitry to carry out the processes described above.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION

Figure 1:
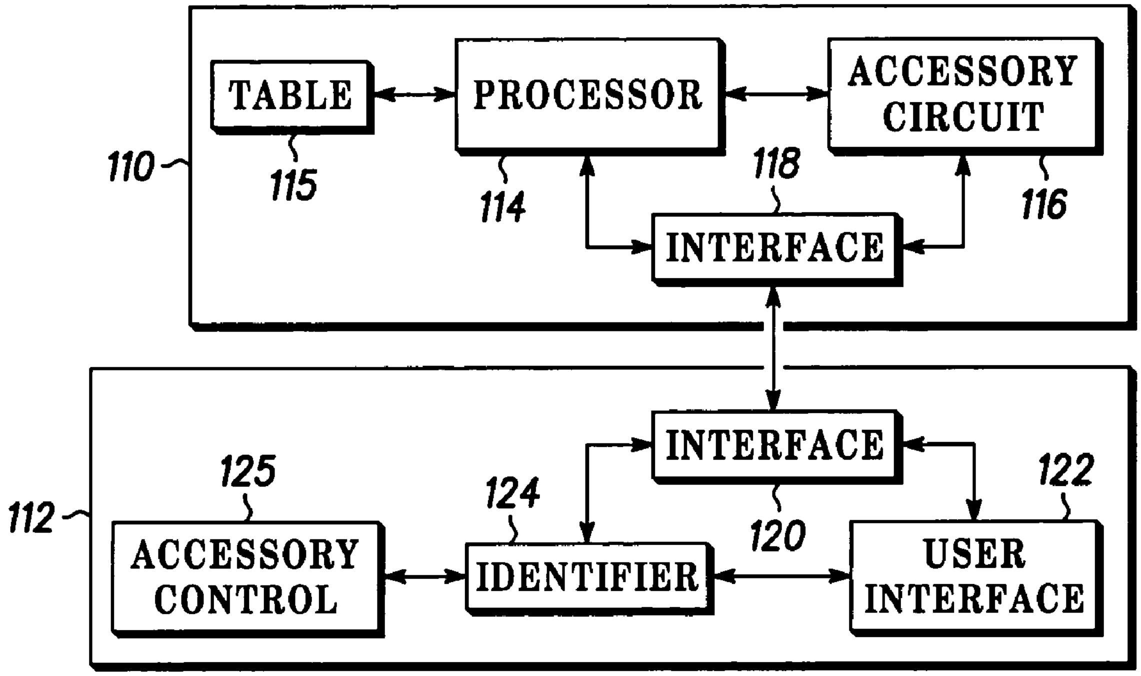
FIG. 1 illustrates a block diagram of a system for operating accessory controls in accordance with an embodiment of the inventive arrangements.

While the specification concludes with claims defining the features of the invention that are regarded as novel, it is believed that the invention will be better understood from a consideration of the following description in conjunction with the drawing figures, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Referring to FIG. 1, a block diagram representing a system 100 in accordance with one embodiment of the invention is illustrated. The system 100 can include a portable electronic device 110 and an accessory 112 that can be coupled to the portable electronic device 110. Suitable examples of a portable electronic device include a mobile telephone and a personal digital assistant, although the invention is not limited to these examples. The portable electronic device 110 can have a processor 114, a table 115, an accessory circuit 116 and an interface 118. As shown in FIG. 1, the processor 114 can be coupled to the table 115 and the accessory circuit 116, and both the processor 114 and the accessory circuit 116 can be coupled to the interface 118. In addition, the accessory 112 can include an interface 120, one or more user interfaces 122 and an identifier 124. The identifier 124 can be coupled to the user interface 122, and both the identifier 124 and the user interface 122 can be coupled to the interface 120. As an option, the accessory 112 can also have an accessory control 125, which can be coupled to the identifier 124.

The interface 118 of the portable electronic device 110 can be designed to receive the interface 120 of the accessory 112. When engaged, signals can pass from the portable electronic device 110 to the accessory 112 and vice-versa. As an example, the interface 120 for the accessory 112 can be a plug or a jack and the interface 118 of the portable electronic device 110 can be a receptacle for receiving such a structure. As another example, the interface 118 of the portable electronic device 110 and the interface 120 of the accessory 112 can be designed to transmit and receive wireless transmissions between one another, instead of relying on a hard-wired connection.

In accordance with one embodiment of the inventive arrangements, when the interface 120 of the accessory 112 is coupled to the interface 118 of the portable electronic device 110, the identifier 124 in the accessory 112 can help generate a parameter. As noted above, the interface 120 can be coupled to the interface 118 through a conventional, hard-wired connection or though a wireless link. The processor 114 can be programmed to measure this generated parameter and can compare it to predetermined measurements in the table 115 in which the predetermined measurements correspond to predetermined operational settings. Based on this comparison, the processor 114 can determine the configuration of the user interface 122 of the accessory 112. For example, the processor 114 can determine whether the accessory 1 12 has one speaker or more than one speaker.

If the processor 114 determines that the accessory 112 includes more than one speaker, the processor 114 can activate one or more audio amplifiers (not shown) in the accessory circuit 116 that can be used to drive the speakers. Conversely, if the processor 114 determines that the accessory 112 merely includes one speaker, the processor 114 can maintain one or more of the audio amplifiers in a deactivated state. This process can prevent needless current drain and can further protect the audio amplifiers from damage. Examples of this concept will be demonstrated below.

The accessory control 125 can be used to permit a user of the accessory 112 to control the operation of the portable electronic device 110. For example, the accessory control 125 can include one or more buttons (not shown), which when activated, can cause the processor 114 to initiate various actions or steps that correspond to the particular button that was activated. Examples of this particular concept will also be presented below.

Figure 2:
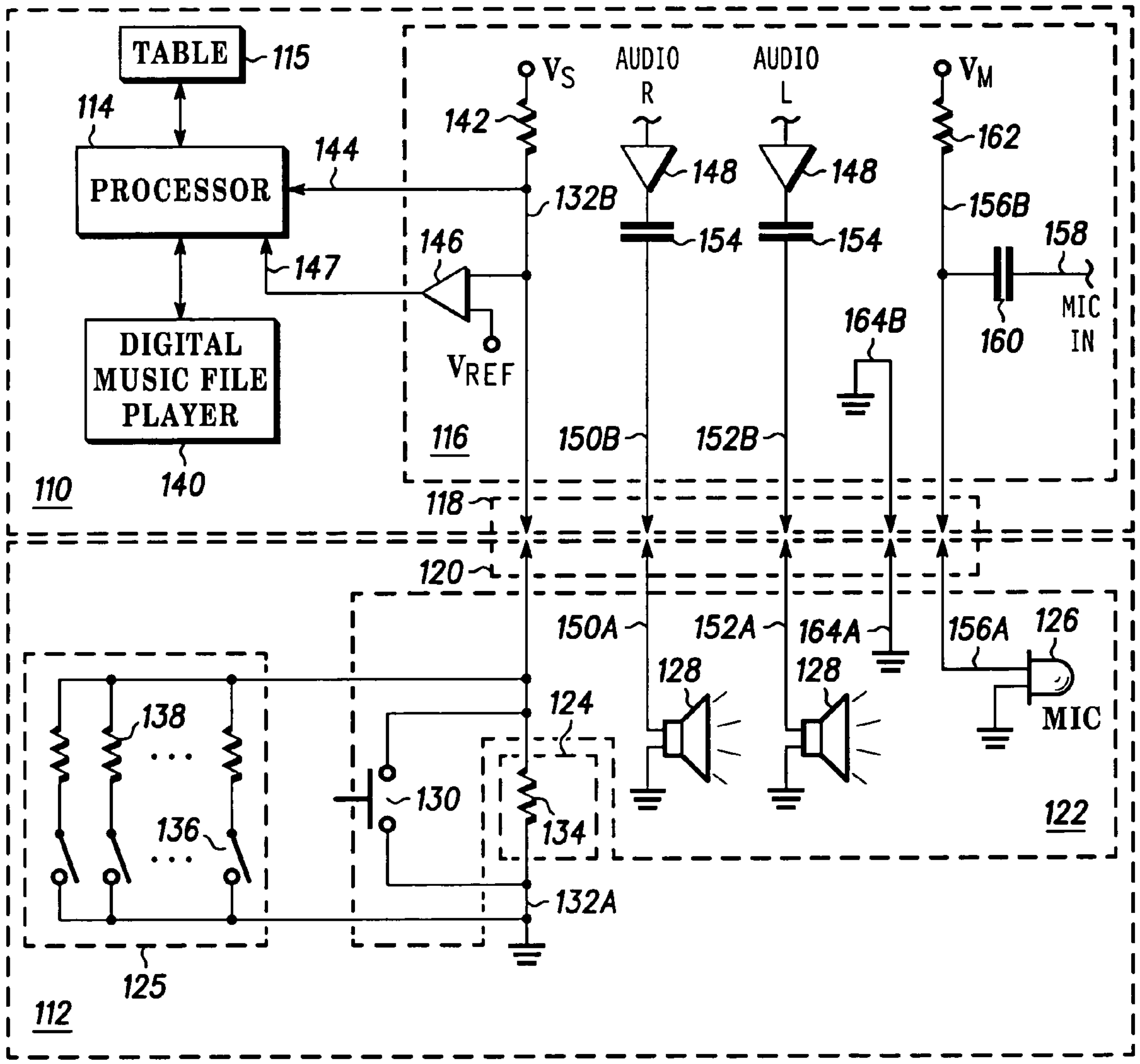
FIG. 2 illustrates a detailed example of the block diagram of FIG. 1 in accordance with an embodiment of the inventive arrangements.

Referring to FIG. 2, an example of the system 100 of FIG. 1 in detail is shown. The portable electronic device 110 can be coupled to the accessory 112. That is, the interface 118 of the portable electronic device 110 can be coupled to or with the interface 120 of the accessory 112. As mentioned earlier, the portable electronic device 110 can be coupled to or with the accessory 112 by a hard-wired connection or a wireless connection (those of ordinary skill in the art will appreciate that changes can be made to the system 100, if necessary, to accommodate wireless transmission between the portable electronic device 110 and the accessory 112). In this particular arrangement, the accessory 112 can be a five-pole headset, although it is understood that the accessory 112 can be any other suitable device.

In one arrangement, the user interface 122 of the accessory 112 can include one or more microphones 126 and one or more speakers 128. As an option, the user interface 122 of the accessory 112 may also include a push-to-talk (PTT) switch or button 130, which can enable a user to engage in dispatch communications. The PTT switch 130 can be located on a contact 132A. In another arrangement, the identifier 124 can be coupled to the contact 132A on which the PTT switch 130 is located. As an example, the identifier 124 can be a resistive element 134, although the identifier 124 can be any other suitable component.

The accessory control 125 can include one or more control switches 136, which can be in series with one or more corresponding resistors 138. In one arrangement, the control switches 136 and the corresponding resistors 138 that make up the accessory control 125 can be in parallel with the identifier 124. These control switches 136 can correspond to functions to be performed by the portable electronic device 110. For example, when activated, the control switches 136 can cause the processor 114 of the portable electronic device 110 to perform an action, i.e., execute a set of instructions. As a more specific example, the portable electronic device 110 can include a digital music file player 140, such as an MP3 player, and the control switches 136 can be buttons on the accessory 112 that can control the operation of the digital music file player 140.

The accessory circuit 116 of the portable electronic device 110 can also include a contact 132B, which can correspond to the contact 132A of the accessory 112 to permit the transfer of signals between the two devices. A voltage source $V_S$ and a pull-up resistor 142 can be coupled to the contact 132B. In addition, an input 144 can be fed into the processor 114 to enable the processor 114 to measure parameters associated with the contacts 132A and 132B. A comparator 146, which can receive a reference voltage $V_{REF}$, can also be coupled to the contact 132B, and the comparator 146 can provide an input 147 to the processor 114. The comparator 146, along with the reference voltage $V_{REF}$, can be used to enable the processor 114 to determine when the PTT switch 130 has been opened or closed or when any of the control switches 136 of the accessory control 125 have been activated. It is understood that, while not shown here, the processor 114 can include any suitable number of analog-to-digital converters or input/outputs to enable the processor 114 to receive and process signals.

The accessory circuit 116 of the portable electronic device 110 can include one or more audio amplifiers 148. In this example, the portable electronic device 110 can include two audio amplifiers 148, where one audio amplifier 148 can drive a right speaker 128, and the other audio amplifier 148 can drive a left speaker 128. The right speaker 128 can be coupled to a contact 150A, and the audio amplifier 148 used to drive the right speaker 128 can be coupled to a corresponding contact 150B. Similarly, the left speaker 128 can be coupled to a contact 152A, and the audio amplifier 148 used to drive the left speaker 128 can be coupled to a corresponding contact 152B. A capacitor 154 can be positioned on the output of the audio amplifiers 148.

As noted above, the user interface 122 of the accessory 112 may also include one or more microphones 126, which can be coupled to a contact 156A. Additionally, the accessory circuit 116 of the portable electronic device 110 can include a microphone input 158, which can be coupled to a corresponding contact 156B through a capacitor 160. The accessory circuit 116 can also have a microphone voltage source $V_M$ and a resistor 162, both of which can be coupled to the contact 156B. Further, the user interface 122 can include a ground contact 164A, and the accessory circuit 116 can have a corresponding ground contact 164B.

Figure 3:
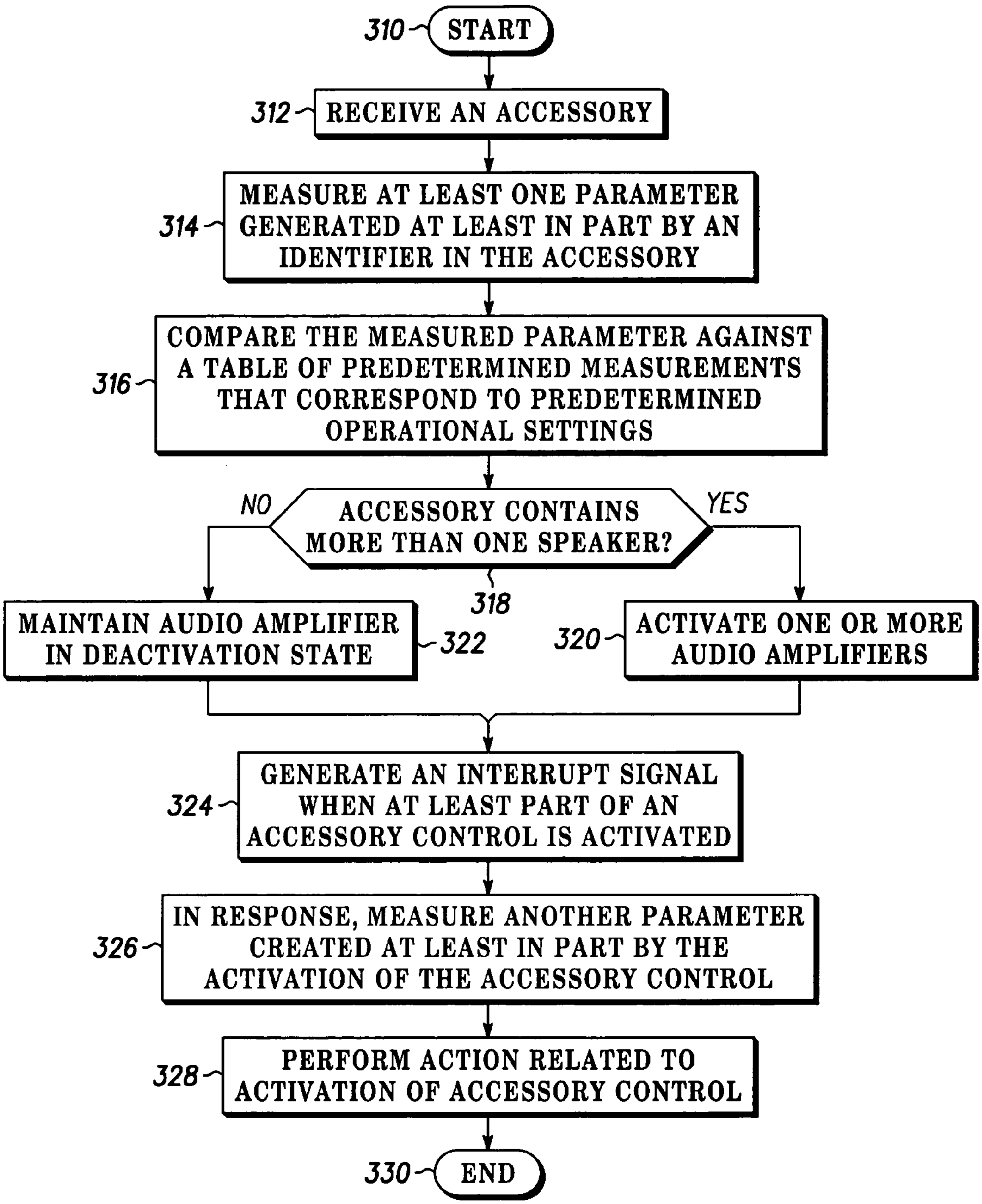
FIG. 3 illustrates a method for operating accessory controls in accordance with an embodiment of the inventive arrangements.

Referring to FIG. 3, a method 300 of operating accessory controls is shown. When describing FIG. 3, reference will be made to FIG. 2. Nevertheless, it must be understood that the invention is in no way limited to the system described in FIG. 2 (or FIG. 1, for that matter) or the method 300 shown in FIG. 3. At step 310, the method 300 can begin, and at step 312, an accessory can be received. For example, referring to FIGS. 1 and 2, the portable electronic device 110 can receive the accessory 112. This receipt can be through a hard-wired connection or even a wireless connection. As is known in the art, when the portable electronic device 110 receives the accessory 112, the processor 114 can be signaled to enable the processor 114 to determine that such a receipt has occurred.

Referring back to FIG. 3, at step 314, at least one parameter can be measured in which the parameter can be generated at least in part by an identifier in the accessory. The measured parameter can be compared against a table of predetermined measurements that correspond to predetermined operational settings, as shown at step 316. For example, referring back to FIG. 2, the voltage source $V_S$ can be powered up, and the pull-up resistor 142 and the resistor 134 (the identifier 124) can form a voltage divider network. The value of the resistor 134 can produce a specific voltage that the processor 114 can read through the input 144. The processor 114 can then compare the voltage reading against one or more predetermined voltage readings in the table 115. If there is a match, the processor 114 can access predetermined operational settings from the table 115, and the processor 114 can use these operational settings to configure components in the portable electronic device 110 (or even the accessory 112) to ensure an efficient operation of the accessory 112.

Figure 4:
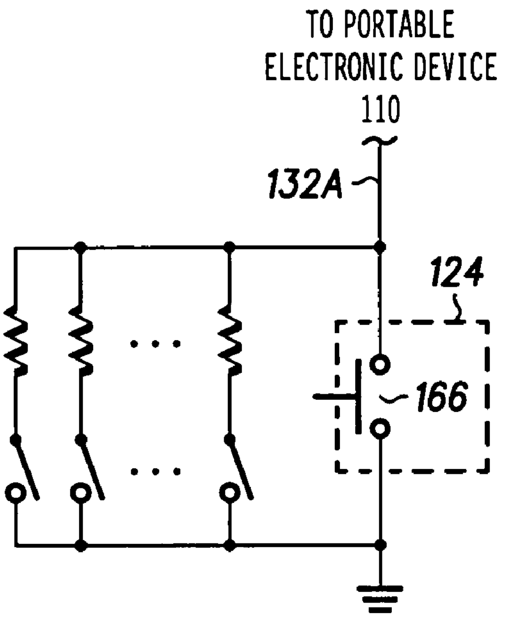
FIG. 4 illustrates an example of a portion of a system for operating accessory controls in accordance with an embodiment of the inventive arrangements.
Figure 5:
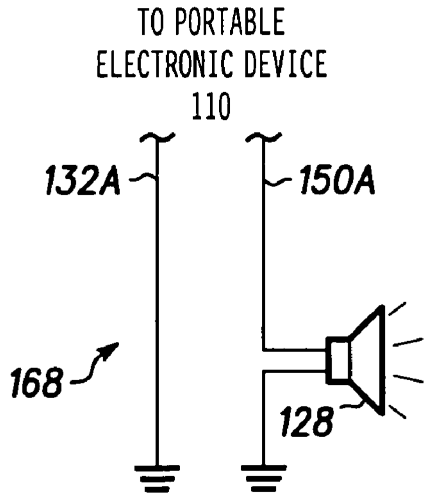
FIG. 5 illustrates another example of a portion of a system for operating accessory controls in accordance with an embodiment of the inventive arrangements.

In addition to a resistor, the identifier 124 can be in the form of other arrangements. For example, referring to FIG. 4, the identifier 124 can be an open circuit 166, and referring to FIG. 5, the identifier 124 may be a short circuit 168, both of which may be part of the contact 132A. Only a portion of the overall system 100 is shown in FIGS. 4 and 5. In either arrangement, the processor 114 of the portable electronic device 110 (see FIG. 2) can detect the presence of the open circuit 166 of FIG. 4 or the short circuit 168 of FIG. 5. As such, the open circuit 166 and the short circuit 168, similar to the resistor 134, can help generate a parameter (e.g., a voltage) that can be measured for purposes of determining one or more operational settings.

In one arrangement, if the accessory 112 includes a PTT switch 130, the PTT switch 130 can serve as the open circuit 166 when the PTT switch 130 is in an open position. Of course, other suitable arrangements can be used to create the open circuit 166. For example, a blocking capacitor can be used to create the open circuit 166. For the short circuit 168, the accessory 112 may not include the PTT switch 130 or the accessory control 125; it may just be a ground connection. In both the open circuit 166 and short circuit 168 embodiments, the accessory 112 more than likely will include only one speaker 128. Although illustrated as creating a short circuit when pressed or activated, the PTT button 130 can be arranged to create an open circuit when pressed.

Referring back to the method 300 of FIG. 3, at decision block 318, a decision can be made as to whether the accessory contains more than one speaker. If it does, then at step 320, one or more audio amplifiers can be activated. Conversely, if it does not, then at step 322, one or more audio amplifiers can be maintained in a deactivated state. For example, referring once again to FIG. 2, based on the predetermined operational settings in the table 115, the processor 114 can activate both audio amplifiers 148 if the accessory 112 includes two speakers 128 (the accessory 112 can be a stereo headset). That is, both audio amplifiers 148 have a speaker 128 to drive, and both audio amplifiers 148 can be turned on. For purposes of the invention, the term activate can mean placing a component from a non-operational state into an operational state or keeping an operating component in that state.

Alternatively, the processor 114 can maintain one of the audio amplifiers 148 in a deactivated state if the accessory 112 only contains one speaker 128 (the accessory 112 is a mono headset). The audio amplifier 148 that can be deactivated can be the audio amplifier 148 that has no speaker 128 to drive. The decision to maintain the audio amplifier 148 in a deactivated state can be made in accordance with the operational settings that were accessed from the table 115, which were based on the generated parameter. By keeping one or more audio amplifiers 148 in a deactivated state based on the number of speakers 128 in the accessory 112, the needless drain of current can be stopped. For purposes of the invention, the phrase "maintain in a deactivated state" can mean placing a component from an operational state to a non-operational state or keeping a non-operating component in such a state.

In another arrangement of the invention, if the PTT switch 130 is closed prior to the measuring and comparing steps 314, 316 of FIG. 3, the processor 114 can maintain one or more of the audio amplifiers 148 in a deactivated state. Once the PTT switch 130 is opened, the processor 114 can then determine the proper configuration of the audio amplifiers 148.

Figure 6:
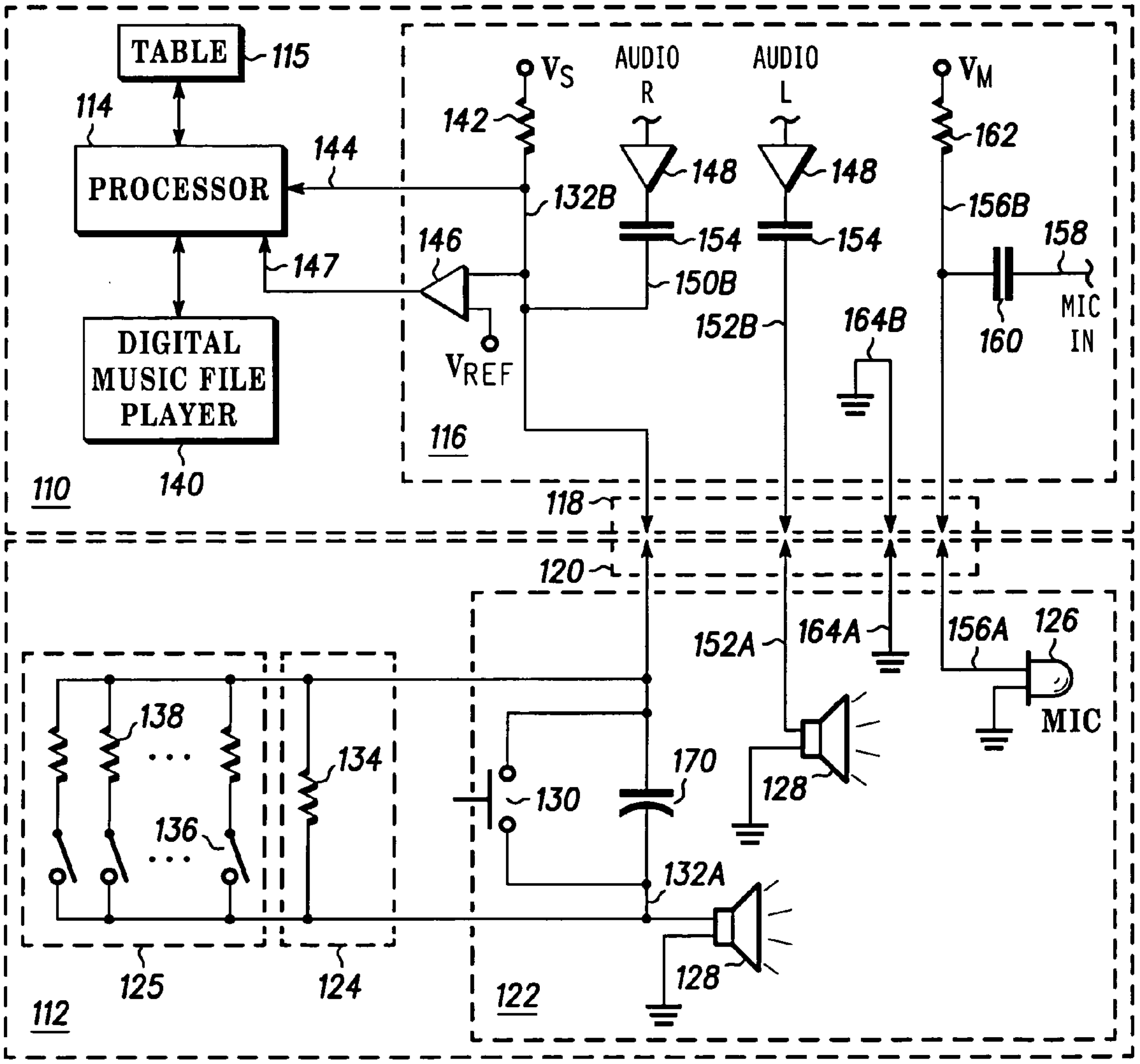
FIG. 6 illustrates another detailed example of the block diagram of FIG. 1 in accordance with an embodiment of the inventive arrangements.

It is understood that the invention is in no way limited to the system 100 shown in FIG. 2, as any other suitable system can be used to practice the inventive arrangements. One example of such a suitable system is shown in FIG. 6. In this arrangement, the accessory 112 can be a four-pole headset. For example, the PTT switch 130, the identifier 124 and the accessory control 125 can all be incorporated into the contact 132A, to which one of the speakers 128 may be coupled. Thus, the contact 152A (see FIG. 2) can be integrated into the contact 132A. In addition, the contact 150B can be coupled to the contact 132B in the portable electronic device 110. A capacitor 170 may be incorporated into the contact 132A as well to enable the proper operation of the speaker 128 and to enable the processor 114 to perform its functions as described above. Although the identifier 124 in this example is the resistor 134, those of ordinary skill in the art will appreciate that, through proper configuration of the components of the accessory 112, the identifier 124 can also be an open circuit or a short circuit, similar to that described in FIGS. 4 and 5.

Figure 7:
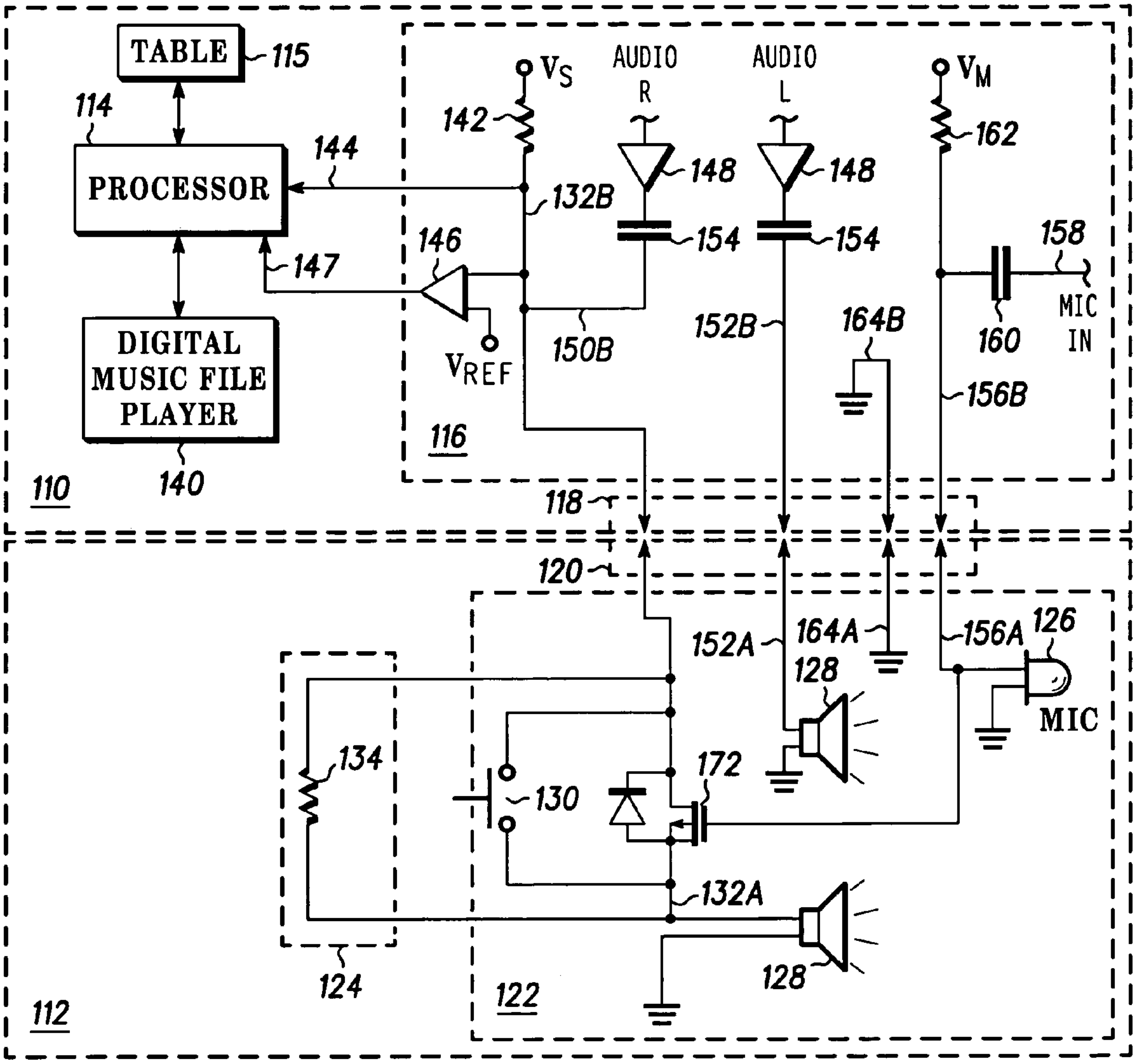
FIG. 7 illustrates yet another detailed example of the block diagram of FIG. 1 in accordance with an embodiment of the inventive arrangements.

Referring to FIG. 7, yet another example of a system 100 for operating accessory controls is shown. Here, similar to the system 100 of FIG. 6, the accessory 112 can be a four-pole headset. In the system 100 of FIG. 7, however, a switch 172, such as a field effect transistor (FET), can be incorporated into the contact 132A in place of a capacitor. As an example, the contact 156A (input to the microphone 126) can be used to drive the switch 172.

In operation, the voltage supply $V_S$ can be powered up, and the microphone voltage source $V_M$ can be turned off. At this point, barring the closing of the PTT switch 130, the processor 114 can determine the number of speakers 128 that the accessory 112 includes and can set the proper configuration of the portable electronic device 110 in accordance with the process described earlier. Once this determination is made, the microphone voltage source $V_M$ can be turned on, which can permit the microphone 126 and the speaker(s) 128 to function properly. Again, it must be noted that the systems shown in FIGS. 6 and 7 are merely examples, as any other suitable system can be used in accordance with the inventive arrangements.

As noted earlier, the accessory 112 can optionally include an accessory control 125, which can include control switches 136 for operating, for example, the digital music file player 140. Referring back to FIG. 3, at step 324, an interrupt signal can be generated when at least part of an accessory control is activated. In response, another parameter can be created at least in part by the activation of the accessory control, and this parameter can be measured, as shown at step 326. At step 328, an action related to the activation of the accessory control can be performed, and the method 300 can stop at step 330.

Referring back to FIG. 2 once again, an example of this process will now be illustrated. If one of the control switches 136 is closed or otherwise activated, the resistor 138 in series with that control switch 136 can become part of a voltage divider network with the pull-up resistor 142 of the portable electronic device 110. Specifically, the resistor 138 can be in parallel with the resistive element 134. This process can cause an interrupt signal to be generated, which the processor 114 can receive through the input 147. When the resistor 138 becomes part of the voltage divider network, another parameter, i.e., voltage, can be generated and the processor 114 can measure this voltage at the input 144. The processor 114 can compare this measurement to predetermined measurements in the table 115 and can execute a set of instructions based on this comparison. As an example, if the control switch 136 corresponds to a play button for the digital music file player 140, the processor 114 can execute a set of instructions that can cause the digital music file player 140 to play a particular music file.

It must be noted, however, that the invention is not limited to this particular example, as other methods or structure can be incorporated into the system 100 of FIG. 2 for permitting a user to control the operation of the portable electronic device 110 through the accessory 112. Moreover, such methods and structure are not limited to use in the system of FIG. 2, as they can be implemented into any other suitable system.

In addition, while the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for operating accessory controls, comprising the steps of:

at a portable electronic device, receiving an accessory;

measuring at least one parameter generated at least in part by an identifier in the accessory; and in response to the measuring step, activating an audio amplifier in the portable electronic device, wherein the audio amplifier is only activated if the accessory contains more than one speaker.

2. The method according to claim 1, further comprising the step of maintaining the audio amplifier in a deactivated state if the accessory contains only one speaker.

3. The method according to claim 1, further comprising the step of comparing the measured parameter against a table of predetermined measurements that correspond to predetermined operational settings.

4. The method according to claim 1, wherein the accessory is a headset for coupling to the portable electronic device and the headset is at least one of a stereo headset accessory and a mono headset accessory.

5. The method according to claim 4, wherein the headset is at least one of a four-pole headset with push-to-talk capability and a five-pole headset with push-to-talk capability.

6. The method according to claim 1, wherein the identifier is at least one of a resistive element, an open circuit and a short circuit and the measured parameter is a voltage.

7. The method according to claim 1, further comprising the steps of:

generating an interrupt signal when at least part of an accessory control is activated; and in response to the generating step, measuring another parameter created at least in part by the activation of the accessory control.

8. The method according to claim 7, wherein the accessory control is a number of control switches that correspond to functions to be performed by a portable electronic device and wherein the control switches are in parallel with the identifier.

9. The method according to claim 8, wherein the control switches are buttons on the accessory that control the operation of a digital music file player.

10. An accessory for coupling to a portable electronic device, comprising:

an interface for coupling to the portable electronic device;

an identifier, wherein the identifier generates at least in part a parameter; and at least one speaker, wherein only if the accessory contains more than one speaker, the parameter generated at least in part by the identifier causes an audio amplifier that drives one of the speakers, to be activated, wherein the audio amplifier is in the portable electronic device.

11. The accessory according to claim 10, wherein the parameter generated at least in part by the identifier causes the audio amplifier to be deactivated if the accessory contains only one speaker.

12. The accessory according to claim 10, wherein the audio amplifier is in the portable electronic device and wherein the generated parameter is measured against a table of predetermined measurements that correspond to predetermined operational settings.

13. The accessory according to claim 10, wherein the accessory is at least one of a stereo headset accessory and a mono headset accessory.

14. The accessory according to claim 13, wherein the accessory is at least one of a four-pole headset with push-to-talk capability and a five-pole headset with push-to-talk capability.

15. The accessory according to claim 10, wherein the identifier is at least one of a resistive element, an open circuit and a short circuit and the generated parameter is a voltage.

16. The accessory according to claim 10, further comprising an accessory control having a number of control switches that correspond to functions to be performed by the portable electronic device, wherein the control switches are in parallel with the identifier.

17. The accessory according to claim 16, wherein when one of the control switches of the accessory control is activated, the control switch causes an interrupt signal to be generated and another measurable parameter to be created.

18. The accessory according to claim 16, wherein the control switches are buttons on the accessory that control the operation of a digital music file player.

19. A system for operating accessory controls, comprising:

an accessory having an identifier and an interface, wherein the identifier generates at least in part a parameter; and a portable electronic device having at least two audio amplifiers for driving corresponding speakers of the accessory, an interface and a processor, wherein the accessory interface couples to the portable electronic device interface;

wherein the processor is programmed to measure the generated parameter and in response, activate the two amplifiers only if the accessory has more than one speaker.

20. The system according to claim 19, wherein the processor is programmed to maintain one of the amplifiers in a deactivated state if the accessory contains only one speaker.

21. The system according to claim 19, wherein the portable electronic device further comprises a table of predetermined measurements that correspond to predetermined operational settings, wherein the processor is further programmed to compare the generated parameter against the table.

22. The system according to claim 19, wherein the accessory further comprises an accessory control that when activated, generates an interrupt to the processor of the portable electronic device and wherein the processor is further programmed to measure a parameter created at least in part by the activation of the accessory control.

23. The system according to claim 22, wherein the accessory control includes a number of control switches that correspond to functions to be performed by the processor of the portable electronic device and wherein the control switches are in parallel with the identifier of the portable electronic device.

24. The system according to claim 23, wherein the portable electronic device further comprises a digital music file player and wherein the control switches are buttons on the accessory that control the operation of the digital music file player.

25. A portable electronic device, comprising:

an interface for receiving an accessory having an identifier;

at least two audio amplifiers for driving speakers of the accessory; and a processor, wherein the processor is programmed to measure a parameter generated at least in part by the identifier of the accessory and in response, activate both amplifiers only if the accessory includes more than one speaker.

26. The portable electronic device according to claim 25, wherein the processor is further programmed to maintain one of the audio amplifiers in a deactivated state if the accessory contains only one speaker.

27. The portable electronic device according to claim 25, further comprising a table of predetermined measurements that correspond to predetermined operational settings, wherein the processor is further programmed to compare the generated parameter against the table.

* * * * *